US010512189B1

(12) United States Patent
Ni et al.

(10) Patent No.: US 10,512,189 B1
(45) Date of Patent: Dec. 17, 2019

(54) SERVER WITH MOVEABLE SIGNAL CABLE AND CABLE SLEEVE

(71) Applicant: QUANTA COMPUTER INC., Taoyuan (TW)

(72) Inventors: Hsiao-Tsu Ni, Taoyuan (TW); Yaw-Tzorng Tsorng, Taoyuan (TW); Chun Chang, Taoyuan (TW); Tung-Hsien Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/374,960

(22) Filed: Apr. 4, 2019

(51) Int. Cl.
*H05K 5/00* (2006.01)
*H05K 7/14* (2006.01)

(52) U.S. Cl.
CPC ......... *H05K 7/1487* (2013.01); *H05K 7/1489* (2013.01); *H05K 7/1491* (2013.01)

(58) Field of Classification Search
CPC ........................................................ H05K 5/00
See application file for complete search history.

(56) References Cited

U.S. PATENT DOCUMENTS 6,038,126 A * 3/2000 Weng ...................... G06F 1/189 312/223.2
2008/0298004 A1* 12/2008 Bailey .................. H05K 7/1454 361/679.01

* cited by examiner

*Primary Examiner* — Jerry Wu
(74) *Attorney, Agent, or Firm* — Nixon Peabody LLP; Zhou Lu

(57) ABSTRACT

A server includes a housing, a sled, a cable sleeve mounted to the sled, and an obstruction in the housing. The housing defines a sled channel and a cable channel. The sled can be inserted into the sled channel. A cable is positioned in the cable sleeve. The obstruction is aligned with the cable channel. Prior to the sled being inserted into the housing, the cable sleeve is in a first position aligned with the obstruction and the cable channel. As the sled is inserted into the housing, contact between the cable sleeve and the obstruction moves the cable sleeve to a second position. In the second position, the cable sleeve is not aligned with the obstruction and is positioned in the sled channel. The cable sleeve is biased towards the first position. As the cable sleeve travels past the obstruction, the cable sleeve moves back to the first position.

18 Claims, 9 Drawing Sheets

100
105A
120
102B
112
122
123
101
105B
102A
118
110

SERVER WITH MOVEABLE SIGNAL CABLE AND CABLE SLEEVE

TECHNICAL FIELD

The present disclosure relates generally to a server system. More particularly, aspects of this disclosure relate to a server system with a cable sleeve mounted to a sled. To avoid an obstruction in the server as the sled is inserted into the server, the cable sleeve is designed to move between a first position and a second position.

BACKGROUND

Electronic devices, such as servers, include a housing into which component sleds can be inserted. The component sleds contain a variety of electronic components that can be connected to each other via printed circuit boards (PCBs) or individual cables. The housing of the server can also contain other components, such as one or more backplanes that the sleds can connect to; a power socket into which an external power source can be connected; and an internal power cable which can connect the power socket (and thus the external power source) to the one or more backplanes and/or the component sleds.

FIG. 1 is a perspective view of a prior art server 10 that includes a housing 12 and a sled 14. The sled 14 can be slidably inserted into the housing 12 at a first end 13 of the housing 12. The sled 14 contains electronic components, such as dual in-line memory modules (DIMMs) 16A and 16B. The sled 14 may also include a signal cable (not shown) that connects various electronic components together. The signal cable can be positioned in a cable channel 18 that is defined between the DIMMs 16A and 16B. This allows the signal cable to connect component positioned on opposite sides of the DIMMs 16A and 16B.

The server 10 also contains a power socket 20 positioned at the first end 13 of the housing 12. The power socket 20 can connect to an external power source, for example via an external power cable (not shown). Inside of the housing 12, an internal power cable 22 connects to the power socket 20. The power cable 22 generally extends along the length of the housing 12, along a longitudinal axis L. The power cable 22 can connect to sled 14, or any backplanes (not shown) that the server 10 may have.

The width of the power socket 20 (e.g., the extent that the power socket 20 extends along a transverse axis T of the housing 12) is often larger than the width of the power cable 22. This creates an empty space 24 between the power cable 22 and the sled 14 when the sled 14 is inserted into the housing 12. For the signal cable to be positioned in the empty space 24 instead of the cable channel 18, the signal cable would need to be positioned adjacent to the sled 14. Prior to insertion, this signal cable would thus be aligned with the empty space 24.

However, the power socket 20 is also aligned with the empty space 24. Moreover, the combined width of the sled 14 and the power socket 20 is generally equal to the width of the housing 12. The power socket 20 thus forms an obstruction that would block the signal cable from entering the housing 12 if the signal able were to be positioned adjacent to the sled 14 prior to insertion. The signal cable thus cannot be positioned in the empty space 24 when the server 10 is fully assembled. Instead, the signal cable must be located in the cable channel 18. This leaves the empty space 24 unutilized, and reduces the amount of space on the sled 14 available for electronic components. Thus, there is a need for a server that decreases the amount of unused space within the housing, and also increases the amount of available space for electronic components on the sled.

SUMMARY

The various examples of the present disclosure are directed towards servers that utilized previously unoccupied space. In a first embodiment of the present disclosure, the server comprises a housing, a sled, a cable, and an obstruction (e.g., a power socket) positioned within the housing. The housing at least partially defines a sled channel and a cable channel. The sled is configured to be inserted into the sled channel at a first end of the housing. The sled travels along a longitudinal axis of the housing. The cable is positioned to a cable sleeve, which is mounted to the sled. The obstruction is positioned at the first end of the housing. The obstruction is aligned with the cable channel and the cable along the longitudinal axis. During insertion of the sled into the housing, the cable sleeve moves from a first position relative to the sled, to a second position relative to the sled. In the second position, the cable sleeve is positioned at least partially in the sled channel.

In some examples of the first embodiment, when in the first position, the cable sleeve is positioned in alignment with the cable sleeve and the obstruction along the longitudinal axis.

In some examples of the first embodiment, when in the first position, the obstruction is positioned between the cable sleeve and the cable channel.

In some examples of the first embodiment, when in the second position, the cable sleeve is not positioned in alignment with the obstruction and the cable channel along the longitudinal axis.

In some examples of the first embodiment, contact between the cable sleeve and the obstruction causes the cable sleeve to move to the second position.

In some examples of the first embodiment, the cable sleeve is rotationally mounted to the sled, and the contact between the cable sleeve and the obstruction causes the cable sleeve to rotate to the second position.

In some examples of the first embodiment, an axis of rotation of the cable sleeve is parallel to the longitudinal axis of the housing.

In some examples of the first embodiment, the cable sleeve is biased towards the first position.

In some examples of the first embodiment, the cable sleeve includes one or more torsion springs that are configured to twist responsive to the cable sleeve moving from the first position to the second position. This twisting causes the torsion springs to impart a torque on the cable sleeve to aid in biasing the cable sleeve towards the first position.

In some examples of the first embodiment, the contact between the obstruction and the cable sleeve maintains the cable sleeve in the second position.

In some examples of the first embodiment, as the sled continues to be inserted into the housing, the cable sleeve travels past the obstruction along the longitudinal axis of the housing such that the bias of the cable sleeve causes the cable sleeve to move back to the first position.

In some examples of the first embodiment, the obstruction includes a power socket.

In some examples of the first embodiment, the server further comprises an internal power cable and a power cable cover. The internal power cable is disposed within the housing and is electrically connected to the power socket. The power cable cover at least partially surrounds the internal power cable, and at least a portion of the power cable cover is positioned in alignment with the cable channel and the power socket.

In some examples of the first embodiment, the obstruction has a length that extends within the housing along the longitudinal axis, and a width that extends within the housing along the transverse axis.

In some examples of the first embodiment, a first end of the obstruction is positioned at the first end of the housing, and a second end of the obstruction is positioned at a second end of the housing, away from the first end of the housing along the longitudinal axis.

In some examples of the first embodiment, the width of the obstruction transitions from a first width at the first end of the obstruction to a second width at the second end of the obstruction, the second width being smaller than the first width.

In some examples of the first embodiment, the width of the obstruction: (i) gradually transitions between the first width and the second width along the length of the obstruction, between the first end of the obstruction and the second end of the obstruction; or (ii) abruptly transitions between the first width and the second width, at a point along the length of the obstruction between the first end of the obstruction and the second end of the obstruction.

In some examples of the first embodiment, the obstruction and the cable channel occupy the same position along a transverse axis.

In some examples of the first embodiment, the cable sleeve has a chamfered end piece that is configured to contact the obstruction responsive to the sled being inserted into the housing.

In some examples of the first embodiment, the end piece is chamfered along a width of the cable sleeve and along a height of the cable sleeve such that the end piece tapers to a point configured to contact the obstruction responsive to the sled being inserted into the housing.

In some examples of the first embodiment, contact between the chamfered end piece and the obstruction causes the cable sleeve to rotate away from the sled and away from the obstruction to the second position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
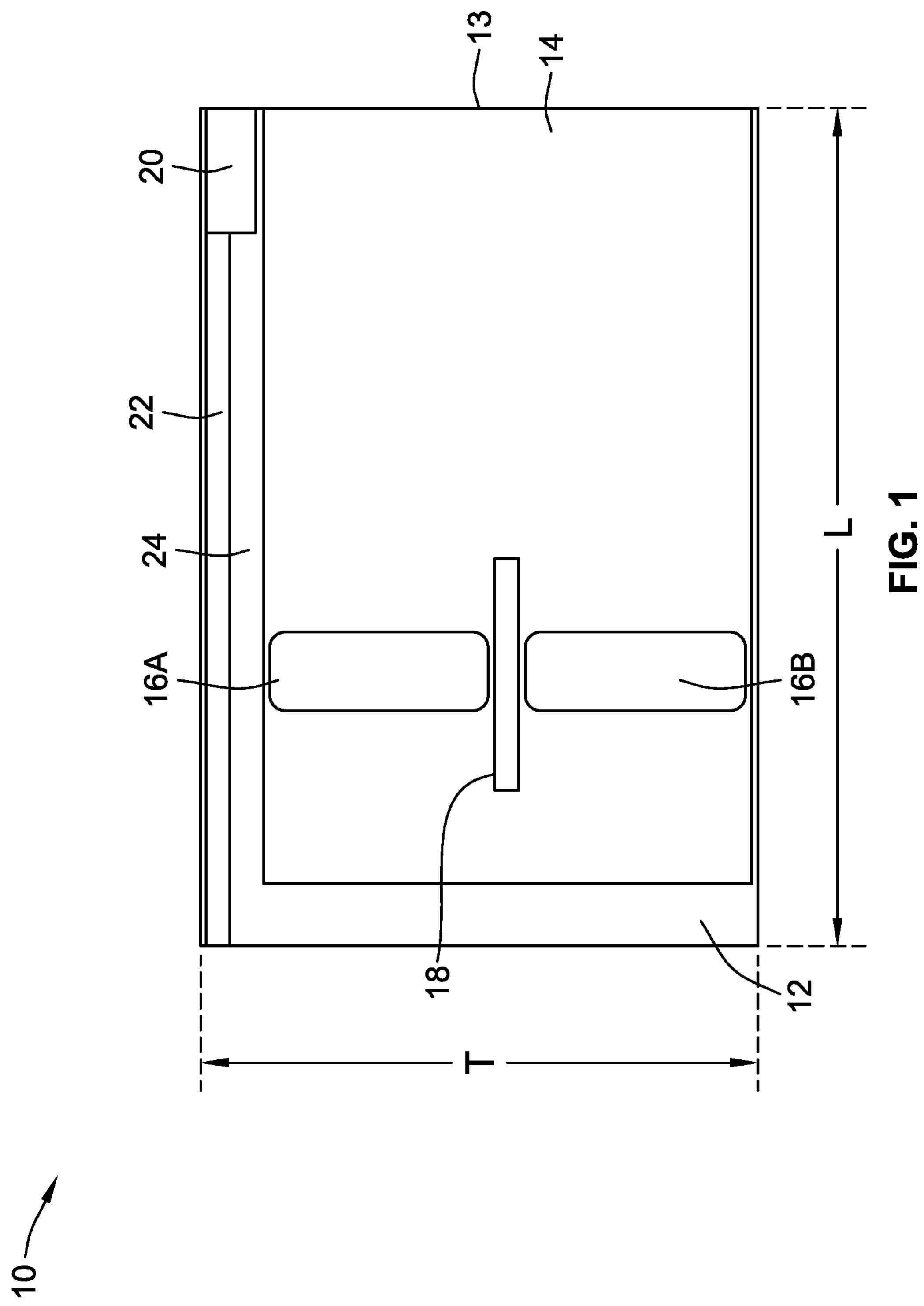
FIG. 1 is a prior art server having a cable channel positioned within a sled and an empty space between the sled and a power cable.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a server that includes a mechanism to move a cable out of the path of any obstructions in the housing of the server during insertion of the component sled, and subsequently move back to empty space that exists within the housing.

Figure 2A:
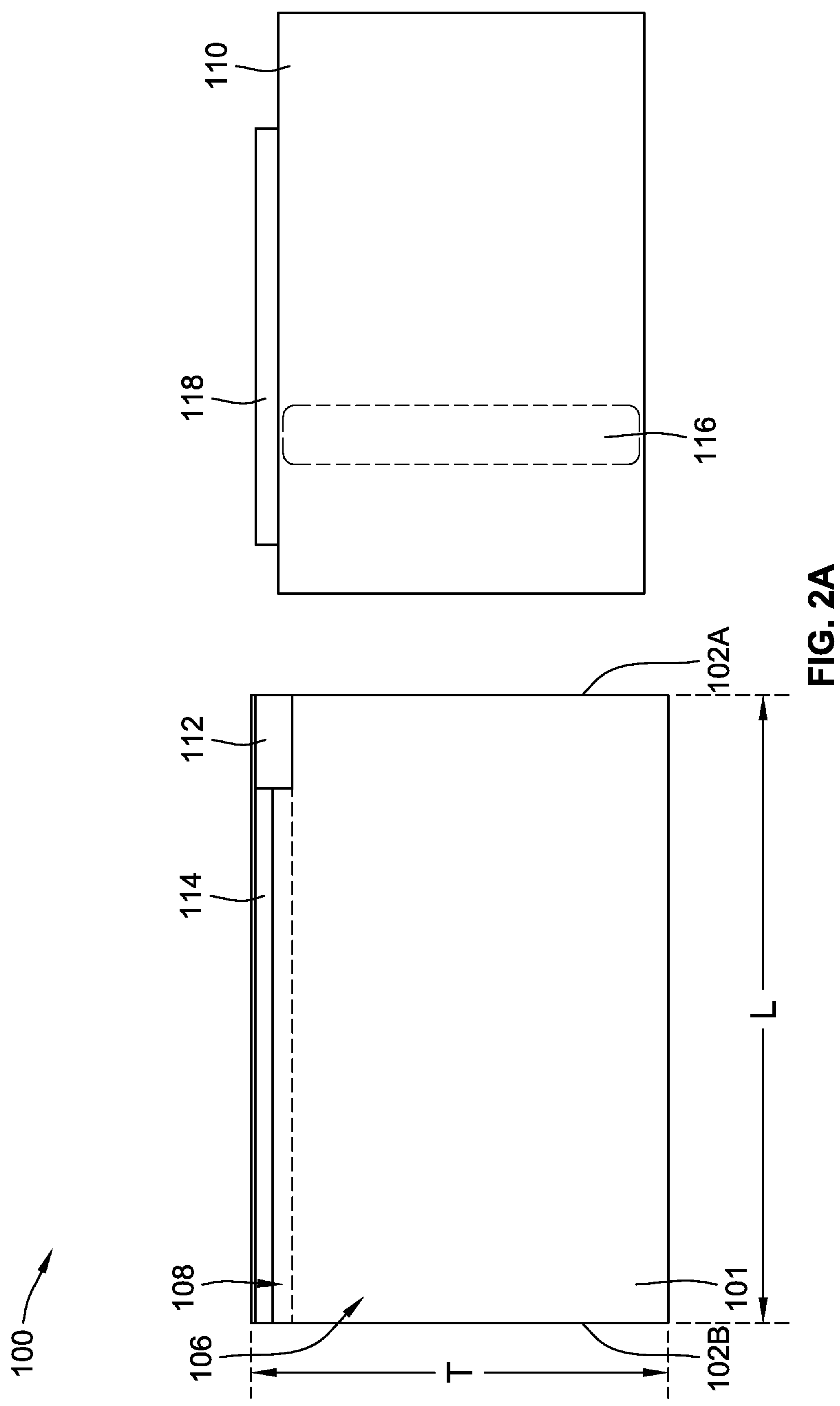
FIG. 2A is a top view of a server having a cable channel positioned between the sled and the power cable, prior to insertion of the sled into a housing of the server.
Figure 2B:
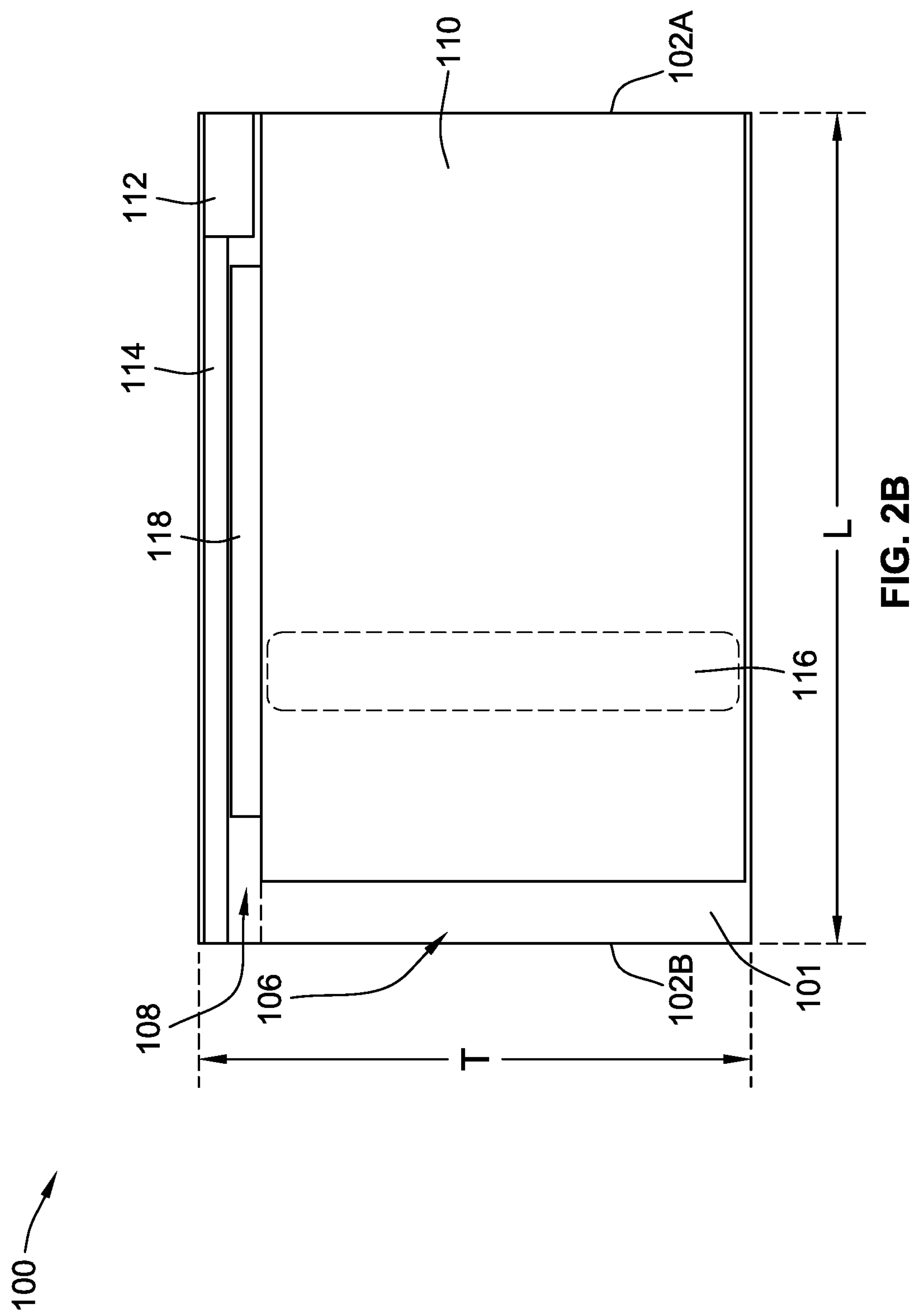
FIG. 2B is a top view of the server of FIG. 2A after insertion of the sled into the housing.

FIGS. 2A and 2B are plan views of an example server 100. FIG. 2A shows the server 100 prior to the insertion of one or more sleds 110. FIG. 2B shows the server 100 after the insertion of one or more sleds 110. While only a single sled 110 is shown in FIGS. 2A and 2B, the server 100 can have any suitable number of sleds 110. The server 100 includes a housing 101 that at least partially defines a sled channel 106 and a cable channel 108. The sled 110 can be slidably inserted into the sled channel 106 at a first end 102A of the housing 101. The sled 110 can then travel along the length of the housing 101 along a longitudinal axis L, towards a second end 102B of the housing 101. The housing 101 also includes a power socket 112 located at the first end 102A of the housing 101, and an internal power cable 114.

The power socket 112 and the power cable 114 are positioned adjacent to the sled 110 within the housing 101. Both the power socket 112 and the power cable 114 have a width that is defined as the dimension along a transverse axis T of the housing 101. Because the width of the power cable 114 is less than the width of the power socket 112, the cable channel 108 is defined between the edge of the sled 110 and the power cable 114. Generally, the power socket 112 is aligned with the power cable 114 and/or the cable channel 108 along the longitudinal axis L. The power socket 112, the power cable 114, and the cable channel 108 thus generally occupy the same position along the transverse axis T.

The sled 110 contains a variety of electronic components, including one or more DIMMs 116. The sled 110 also includes a signal cable 118 that can connect various electronic components to each other. Once the sled 110 is fully inserted into the housing 101 (as shown in FIG. 2B), the signal cable 118 is positioned in the cable channel 108 that is defined between the edge of the sled 110 and the power cable 114. In this configuration, the empty space that often exists in prior server designs (such as the server 10 of FIG. 1) is now utilized as the cable channel 108 for the signal cable 118. As a result, more space on the sled 110 can be occupied by electronic components, such as the one or more DIMMs 116 that span the entire width of the sled 110.

The combined width of the sled 110 and the power socket 112 (e.g., their dimensions along the transverse axis T) is generally equal to the width of the housing 101 itself. As such, the power socket 112 forms the obstruction that blocks the signal cable 118 from being inserted into the housing 101 when the signal cable 118 is positioned adjacent to the sled 110. To insert the sled 110 and the signal cable 118 into the housing 101, the signal cable 118 must be moved out of alignment with the power socket 112 and the cable channel 108 while the sled 110 is being inserted into the housing 101. Once the sled 110 are inserted and the signal cable 118 has traveled past the power socket 112 (and any other component forming part of the obstruction), the signal cable 118 can be moved back to its original position, as shown in FIG. 2B. In this position with the sled 110 inserted, the signal cable 118 is positioned in the cable channel 108.

Figure 3A:
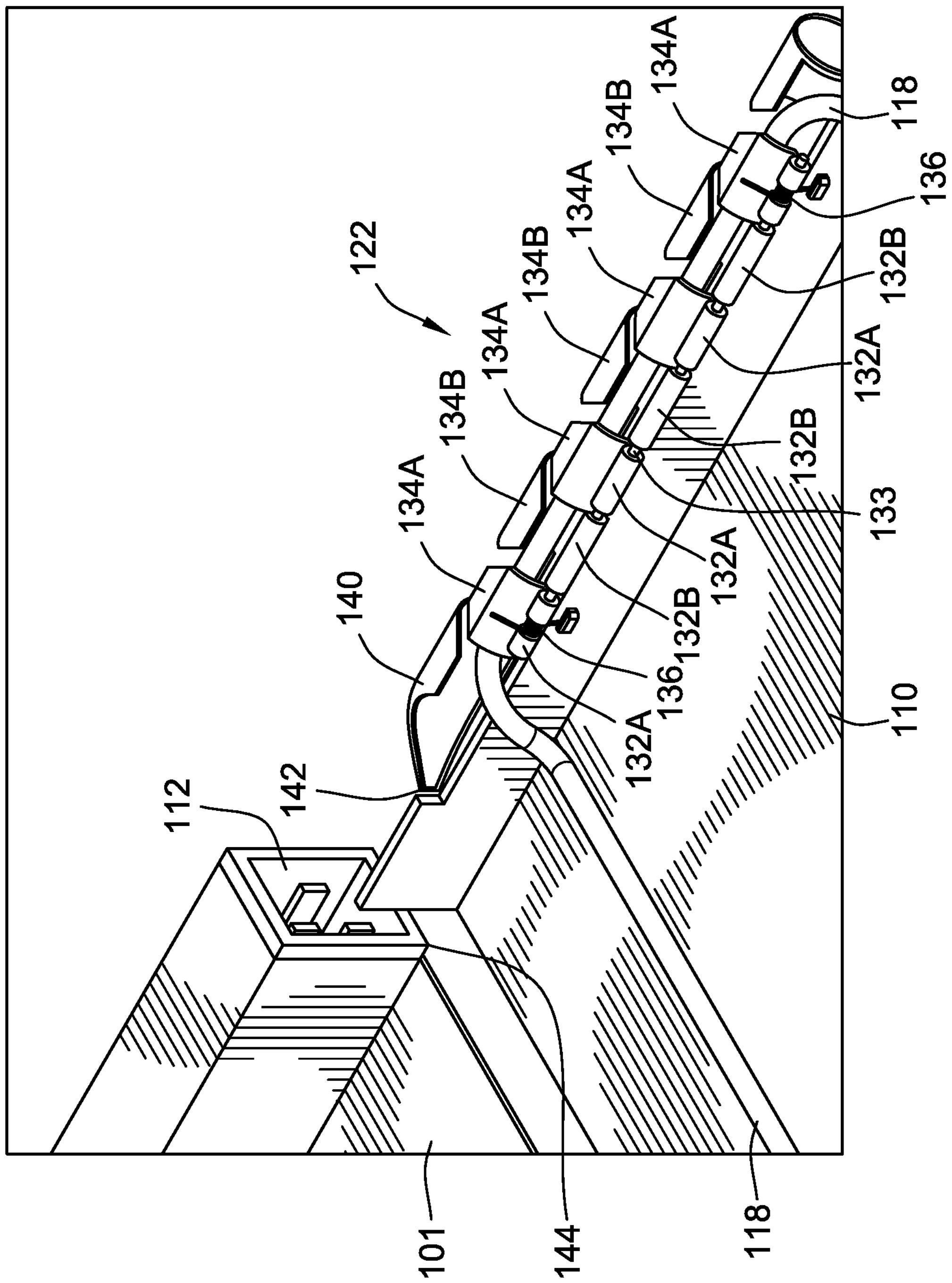
FIG. 3A is a perspective view of a cable sleeve rotationally coupled to the housing of the server of FIGS. 2A and 2B.
Figure 3B:
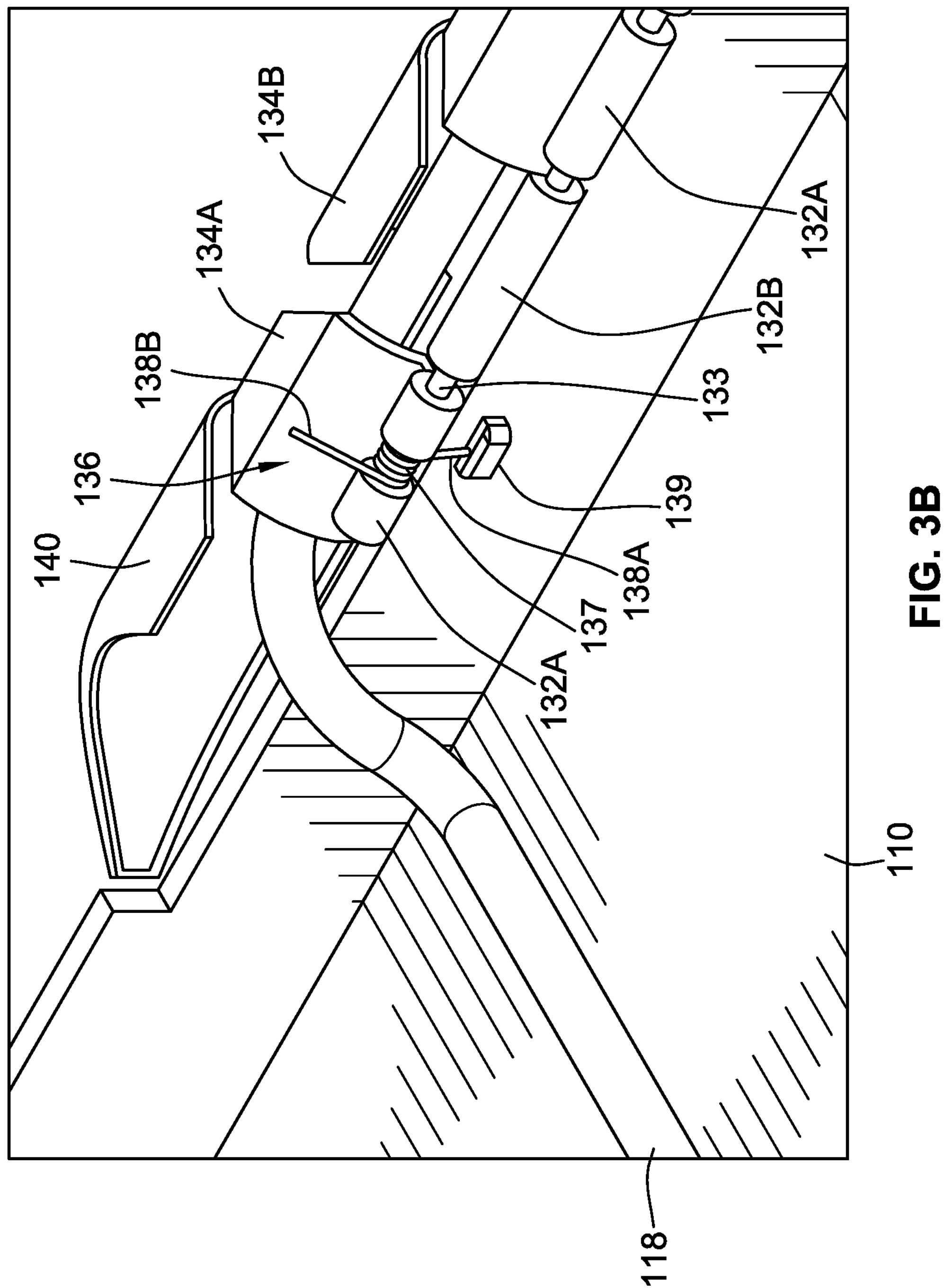
FIG. 3B is a zoomed-in perspective view of a torsion spring that aids in biasing the cable sleeve in a first position.

FIGS. 3A and 3B illustrate a mechanism that automatically moves the signal cable 118 as the sled 110 is inserted into the housing 101. In this implementation, the signal cable 118 is contained within a cable sleeve 122. The cable sleeve 122 is rotationally mounted to the sled 110 to move between a first position and a second position, which causes the signal cable 118 to move between positions as well.

In the first position, the cable sleeve 122 and the signal cable 118 are positioned adjacent to the sled 110. Here, the cable sleeve 122 and the signal cable 118 are generally aligned with the power socket 112 and the cable channel 108, and thus are blocked from being inserted into the housing 101. In the second position, the cable sleeve 122 is not aligned with the power socket 112 and the cable channel 108. In this position, the power socket 112 does not block the signal cable 118, and the sled 110 and signal cable 118 can be freely inserted into the housing 101.

In this implementation, the cable sleeve 122 is coupled to the housing 101 in a fashion resembling to a hinge. The cable sleeve 122 is formed from a number of interleaved fingers 134A and 134B. Each finger 134A of the cable sleeve 122 includes a hollow knuckle 132A. The housing 101 includes one or more corresponding hollow knuckles 132B. The knuckles 132A and 132B are generally aligned so that the hollow interiors of the knuckles 132A and 132B align to form an insertion path for a pin 133.

When the pin 133 is inserted through each of the knuckles 132A and 132B, the cable sleeve 122 is physically coupled to the sled 110 and can rotate relative to the sled 110. In some implementations (such as the implementation illustrated in FIGS. 3A and 3B), the knuckles 132A and 132B are positioned in an alternating arrangement. In other implementations, the knuckles 132A and 132B can generally be positioned in any arrangement, so long as the hollow interiors of the knuckles 132A and 132B align to form the insertion path for the pin 133. In some implementations, the cable sleeve 122 has a single knuckle 132A, while the sled 110 also has a single knuckle 132B.

In the implementation illustrated in FIGS. 3A and 3B, fingers 134A and 134B leave portions of the interior of the cable sleeve 122, e.g., where the signal cable 118 rests when inserted into the cable sleeve 122, open to the exterior of the cable sleeve 122. This allows the user to easily inserted the signal cable 118 into and through the cable sleeve 122. In other implementations, the fingers 134A and 134B completely close off the interior of the cable sleeve 122. In still other implementations, the outer periphery of the cable sleeve 122 is a continuous surface such as a barrel or tube, such that the interior of the cable sleeve 122 is only open to the exterior at the ends of the cable sleeve 122.

The cable sleeve 122 includes one or more torsion springs 136 that bias the cable sleeve 122 toward the first position. Each of the torsion springs 136 includes a main body 137 that is coiled around one of the knuckles 132A of the cable sleeve 122. The torsion springs 136 terminate in legs 138A and 138B. Legs 138A of the torsion springs 136 are held stationary relative to the housing 101, for example by being inserted into a small slot 139 defined in the housing 101, or by some other suitable attachment mechanism. Legs 138B of the torsion springs 136 contact a portion of the cable sleeve 122. In the implementation illustrated in FIGS. 3A and 3B, legs 138B contact the respective ones of the interleaved fingers 134A.

Thus, when the cable sleeve 122 is rotated away from first position toward the second position, the fingers 134A of the cable sleeve 122 press against the legs 138B of the torsion springs 136. Because the legs 138A of the torsion springs 136 are held in place, this pressure causes the torsion springs 136 to be compressed in a rotational manner, e.g. twisted or wound. Compression of the torsion springs 136 causes the torsion springs 136 to impart a torque to the cable sleeve 122 that biases the cable sleeve 122 toward the first position. In some implementations, the torsion springs 136 aid in biasing the cable sleeve 122 toward the first position, along with other components or mechanisms.

As is shown in FIGS. 3A and 3B, the end of the cable sleeve 122 nearest the housing 101 includes an end piece 140. The end piece 140 is chamfered along both the width of the cable sleeve 122 (parallel to the transverse axis T) and along the height of the cable sleeve 122 (parallel to an axis that is perpendicular to both the transverse axis T and the longitudinal axis L). In the orientation shown in FIGS. 3A and 3B, this results in the end piece 140 being chamfered in both a horizontal direction and in a vertical direction. However, the direction of the dual chamfer of the end piece 140 can be in any direction, depending on the orientation of the housing 101 and the sled 110.

The end piece 140 thus tapers to a point 142. which in the orientation shown in FIGS. 3A and 3B, is the bottom-most and inward-most corner of the cable sleeve 122. When the cable sleeve 122 reaches the power socket 112, the point 142 generally contacts a corresponding corner 144 of the power socket 112. In the orientation shown in FIGS. 3A and 3B, the corner 144 is the bottom-most and inward-most corner of the cable socket 112. Because of the dual chamfer of the end piece 140, this contact causes the cable sleeve 122 to rotate away from both the power socket 112 and the sled 110, from the first position to the second position. In the orientation shown in FIGS. 3A and 3B, the cable sleeve 122 rotates upward and inward relative to the housing 101 (e.g., upward relative to the sled 110 and inward relative to the power socket 112). However, the specific direction of the rotation of the cable sleeve 122 can vary depending on the orientation of the housing 101 and the sled 110.

If the end piece 140 was not chamfered, the cable sleeve 122 would present a two-dimensional contact surface extending along the height of the cable sleeve 122 and the width of the cable sleeve 122 (the transverse axis T). This two-dimensional contact surface would prevent the sled 110 and the cable sleeve 122 from being inserted into the housing 101 any further. However, due to the two-dimensional chamfer of the end piece 140, the contact between the cable sleeve 122 and the power socket 112 initially occurs at the point 142. As the sled 110 is continually inserted into the housing 101, the location of the contact between the cable sleeve 122 and the power socket 112 moves back along the length of the cable sleeve 122, causing the cable sleeve 122 to rotate upward and inward relative to the housing 101.

In other implementations, the server 100 includes a separate actuator or other mechanism that is configured to physically force the cable sleeve 122 to rotate. For example, the server 100 may include a retractable finger that is coupled to the cable sleeve 122 and retracts to cause the cable sleeve 122 to move from the first position to the second position. In some implementations, the bias on the cable sleeve 122 is generated using components other than the torsion springs 136. For example, when in the second position, the cable sleeve 122 may be compressed between the obstruction and another component within the housing 101. Once the cable sleeve 122 travels past the obstruction, the pressure on the cable sleeve 122 due to the other component moves the cable sleeve 122 back to the first position. The bias can also be generated by using gravity or other mechanisms In any of these implementations, contact between the power socket 112 and the cable sleeve 122 maintains the cable sleeve 122 in the second position as the sled 110 and the cable sleeve 122 continue to be inserted into the housing 101. Once the cable sleeve 122 travels past the power socket 112 (and any other component that forms the obstruction), the bias of the cable sleeve 122 causes the cable sleeve 122 to move back to the first position. Because the cable sleeve 122 has moved past the power socket 112, the cable sleeve 122 is then positioned within the cable channel 108, as shown in FIG. 2B.

FIGS. 4A-7C show perspective, top, and rear views of the server 100 of FIGS. 2A and 2B before, during, and after the sled 110 is inserted into the housing 101 of the server 100. The rear views in FIGS. 4C, 5C, 6C, and 7C are taken looking at a rear edge 123 of the cable sleeve 122. The views in FIGS. 4A-7C show the position of the cable sleeve 122 and the signal cable 118 relative to the sled 110 and the obstruction. Generally, any reference to movement of the signal cable 118 also applies to movement of the cable sleeve 122, unless otherwise noted. Similarly, any reference to movement of the cable sleeve 122 also applies to movement of the signal cable 118, unless otherwise noted.

The housing 101 of the server 100 generally includes a first sidewall 105A and a second sidewall 105B that each extend upwards from a base of the housing 101. The sidewalls 105A and 105B extend from a first or front end 102A of the housing 101 to a second or back end 102B of the housing 101. The sled channel 106 and the cable channel 108 are defined within the housing 101. Both the housing 101 and the sled 110 have a width extending along the transverse axis T and a length extending along the longitudinal axis L.

The power socket 112 is positioned at the first end 102A of the housing 101. The server 100 also includes a power cable guard 120 that protects the internal power cable 114 and extends along the length of the housing 101. The combined width of the power socket 112 and the sled 110 is substantially equal to the width of the housing 101. Thus, in the implementation shown in FIGS. 4A-7C, the obstruction is formed from at least the power socket 112 and the power cable guard 120. In other implementations, the internal power cable 114 does not have the power cable guard 120 protecting it, and thus the obstruction is formed from the power socket 112 and the internal power cable 114. In still other implementations, the obstruction can be formed from other components of the server 100, such as a rack for mounting additional sleds 110.

The cable sleeve 122 is rotationally mounted to the sled 110 along the length of the sled 110 in the longitudinal direction. The pin 133 is inserted through aligned hollow portions in both the housing 101 and the cable sleeve 122. A torsion spring 136 is used to bias the cable sleeve 122 toward the first position. Contained within the cable sleeve 122 is the signal cable 118 that can be used to connect various electronic components together on the first sled 110. As can be seen, the power socket 112 and the power cable guard 120 are aligned with the cable channel 108 along the longitudinal axis L.

Other implementations of the server 100 can also be utilized. For example, the housing 101 can include a top panel that is coupled to the first sidewall 105A and the second sidewall 105B. Further, the server 100 can include a rack onto which another sled 110 can be placed, such that the server 100 includes multiple sleds 110 arranged in a vertical orientation relative to each other. In still other implementations, the power cable guard 120 forms all or part of the rack onto which another sled 110 can be placed.

Figures 4A, 4B, 4C:
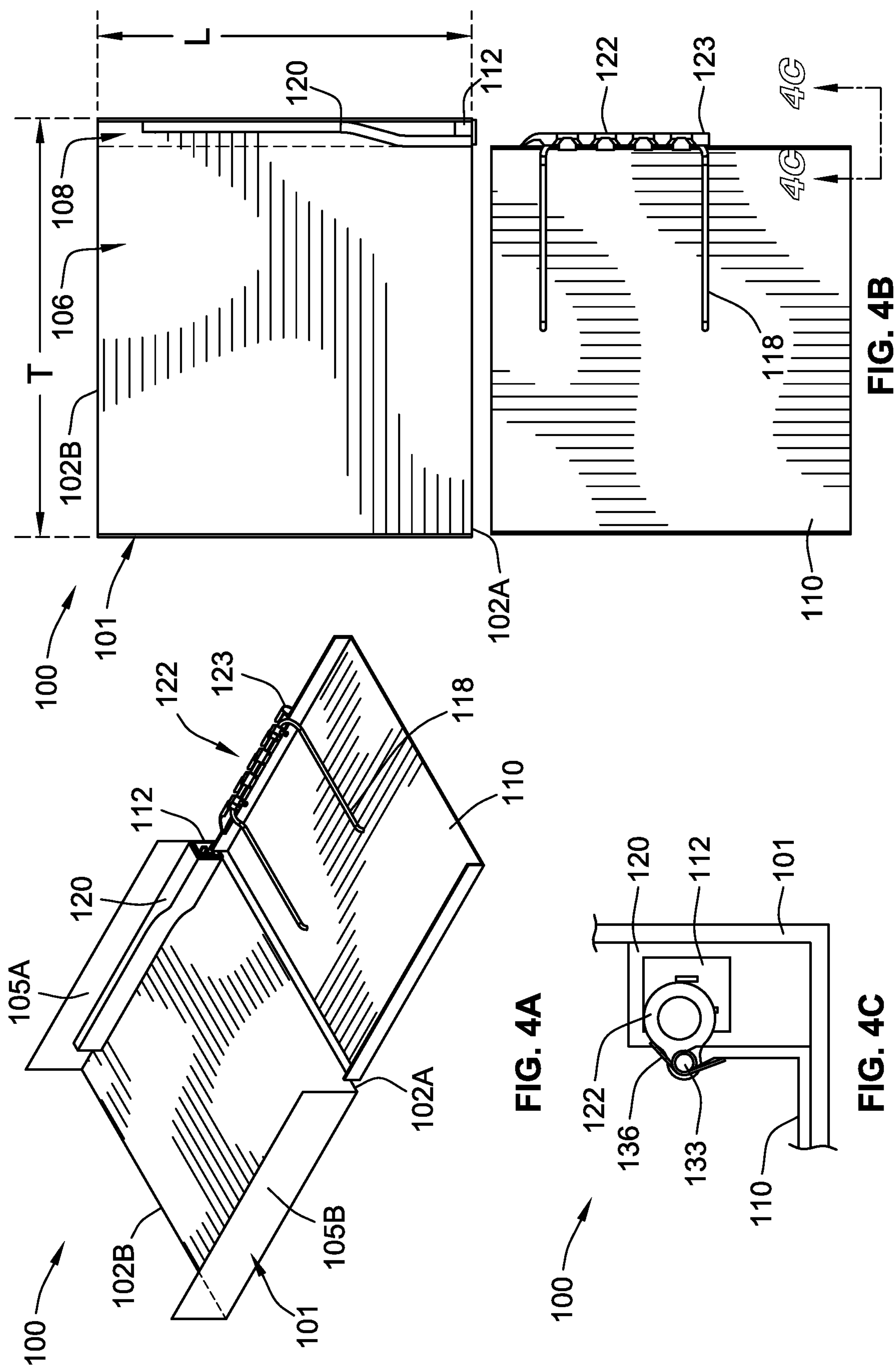
FIG. 4A is a perspective view of the server of FIGS. 2A and 2B prior to the sled being inserted into the server, such that the cable sleeve is in the first position aligned with the cable channel and an obstruction in the sled.
FIG. 4B is a top view of the server of FIGS. 2A and 2B in the position illustrated in FIG. 4A.
FIG. 4C is a rear view of the cable sleeve of FIG. 3A in the position illustrated in FIG. 4A.

FIGS. 4A-4C show the server 100 prior to insertion of the sled 110. The sled 110, the signal cable 118, and the cable sleeve 122 are all positioned outside of the housing 101. The cable sleeve 122 is in the first position relative to the sled

110. When the cable sleeve 122 is in the first position, the cable sleeve 122 (and the signal cable 118 mounted within the cable sleeve 122) is aligned with the power socket 112, the power cable guard 120, and the cable channel 108. These components generally form a line along the longitudinal axis L, and occupy the same position on the transverse axis T. The power socket 112 and the power cable guard 120 thus block the cable sleeve 122 (and the signal cable 118 contained in the cable sleeve 122) from being inserted into the housing 101 when the cable sleeve 122 is in the first position.

Figures 5A, 5B, 5C:
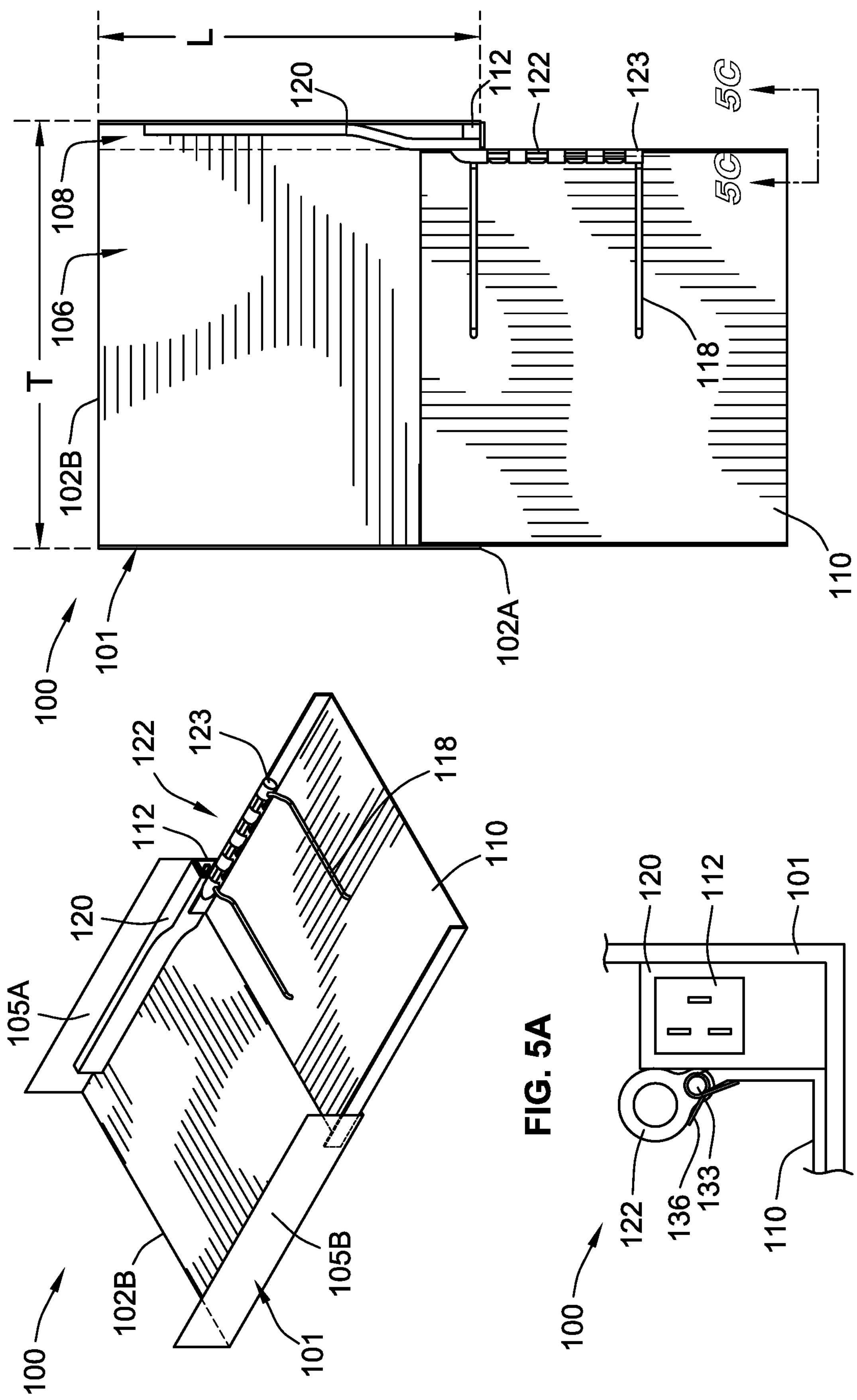
FIG. 5A is a perspective view of the server of FIGS. 2A and 2B when the sled is initially inserted into the server, such that the cable sleeve is in a second position adjacent to the obstruction and outside of the cable channel.
FIG. 5B is a top view of the server of FIGS. 2A and 2B in the position illustrated in FIG. 5A.
FIG. 5C is a rear view of the cable sleeve of FIG. 3A in the position illustrated in FIG. 5A.

FIGS. 5A-5C show the server 100 as the sled 110 is initially inserted into the sled channel 106 of the housing 101. As the cable sleeve 122 advances into the housing 101, the cable sleeve 122 comes into contact with the power socket 112. Due to the chamfer on the portion of the cable sleeve 122 that contacts the power socket 112, this contact causes the cable sleeve 122 and the signal cable 118 to rotate upward and inward away from the power socket 112 and the power cable guard 120 to the second position relative to the sled 110. The axis of rotation of the cable sleeve 122 is generally parallel to the longitudinal axis of the housing 101.

When the cable sleeve 122 and the signal cable 118 mounted within the cable sleeve 122 are rotated to the second position, the cable sleeve 122 and the signal cable 118 are no longer aligned with the power socket 112, the power cable guard 120, or the cable channel 108 along the longitudinal axis L. Instead, the cable sleeve 122 and the signal cable 118 are rotated so that they are positioned above the sled 110, and substantially within the sled channel 106. The cable sleeve 122 is thus unaligned with the power socket 112, the power cable guard 120, and the cable channel 108. In this second position, the first sled 110 and the cable sleeve 122 can continue to be inserted into the housing 101, because nothing blocks the cable sleeve 122 from advancing further into the housing 101.

As can be seen in FIG. 5C, the rotation of the cable sleeve 122 from the first position to the second position rotationally compresses the torsion spring 136 in a twisting fashion. This causes the torsion spring 136 to impart a torque onto the cable sleeve 122, thereby biasing the cable sleeve 122 towards the first position. However, the contact between the cable sleeve 122 and the power cable guard 120 maintains the cable sleeve 122 in the second position.

Figure 6B:
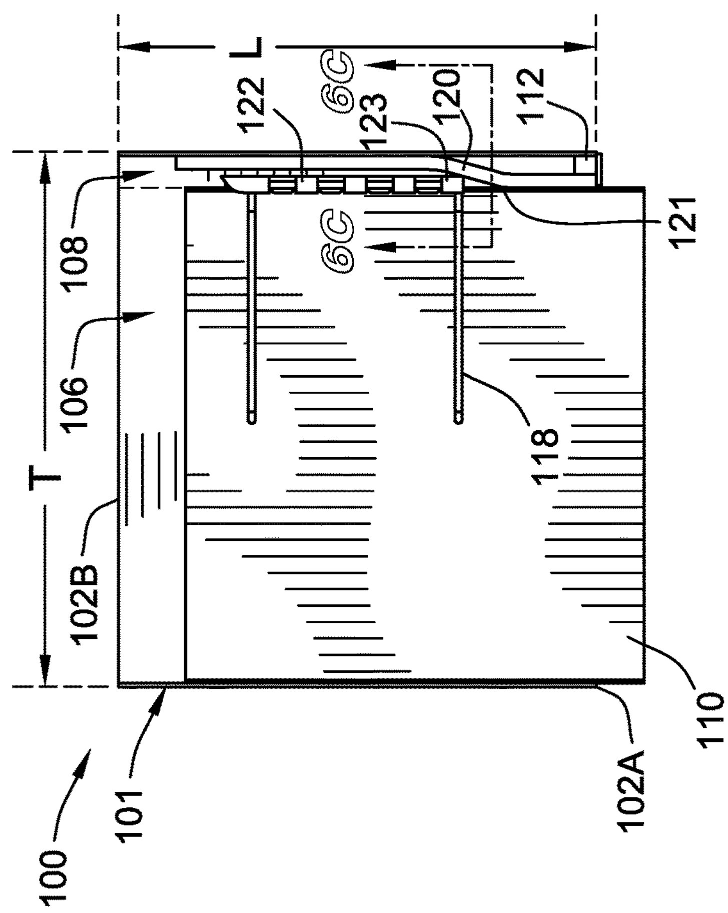
FIG. 6B is a top view of the server of FIGS. 2A and 2B in the position illustrated in FIG. 6A.
Figure 6A:
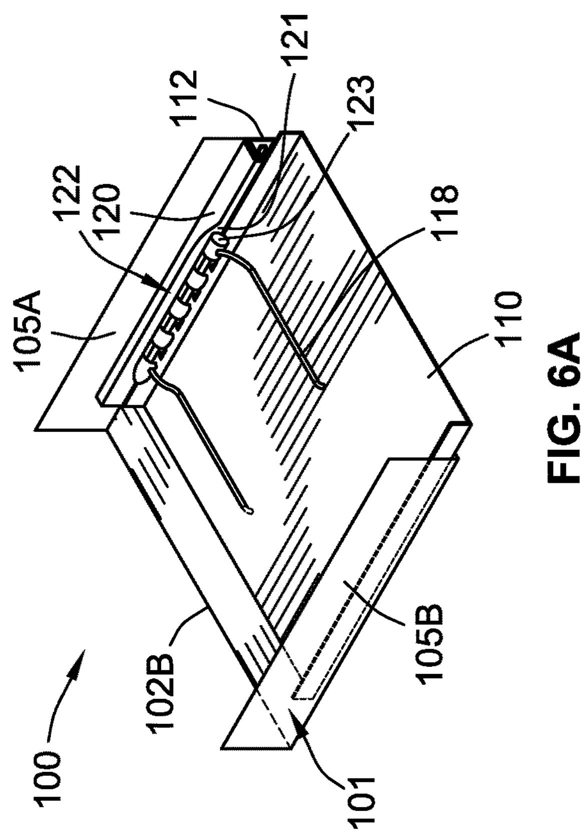
FIG. 6A is a perspective view of the server of FIGS. 2A and 2B as the sled is continued to be inserted into the server such that the cable sleeve has begun to move back to the first position.
Figure 6C:
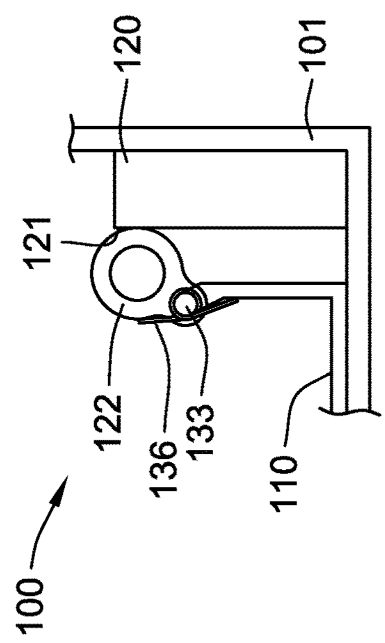
FIG. 6C is a rear view of the cable sleeve of FIG. 3A in the position illustrated in FIG. 6A.

As shown in FIGS. 6A-6C, the cable sleeve 122 continues to travel past the power socket 112 and the power cable guard 120, until the rear edge 123 of the cable sleeve 122 passes a point 121 along the length of the power cable guard 120. At point 121, the width of the power cable guard 120 begins to decrease. In the illustrated implementation, the width of the power cable guard 120 gradually decreases from a maximum width to a minimum width. This gradual decrease occurs along the length of at least a portion of the power cable guard 120. The maximum width of the obstruction occurs at the first end 102A of the housing 101, e.g., where the power socket 112 is located. The minimum width of the obstruction can occur at any location between the first end 102A of the housing 101 and the second end 102B of the housing 101. In the illustrated implementations, the gradual decrease in the width of the power cable guard 120 forms a generally straight line. In other implementations, the gradual decrease forms a curve, a stepped decrease (e.g. a staircase), or any other suitable shape.

In some implementations, the minimum width of the power cable guard 120 is non-zero. In these implementations, the minimum width can be slightly larger than the width of the power cable (not shown in FIGS. 4A-7C), such that the power cable is located between the power cable guard 120 and the first sidewall 105A of the housing 101. In these implementations, the power cable guard 120 can extend all the way to the second end 102B of the housing 101, or can terminate prior to reaching the second end 102B of the housing 101.

In other implementations, the width of the power cable guard 120 decreases to zero, either (i) at the second end 102B of the housing 101, or (ii) at a point between the first end 102A of the housing 101 and the second end 102B of the housing 101. In still other implementations, the transition in the width of the power cable guard 120 from its maximum width to its minimum width is abrupt or immediate, rather than gradual.

Due to the bias on the cable sleeve 122 from the compression of the torsion spring 136, the cable sleeve 122 automatically begins to move back to the first position (e.g., toward first sidewall 105A of the housing 101) once the rear edge 123 of the cable sleeve 122 passes the point 121 where the power cable guard 120 has its maximum width. The gradual decrease in the width of the power cable guard 120 prevents the cable sleeve 122 from immediately snapping back to the first position after traveling past the point 121, where the power cable guard 120 has its maximum width. Instead, the cable sleeve 122 can gradually rotate from the second position back to the first position as the sled 110 is inserted into the housing 101. This can help prevent damage to the electronic components that may occur if the cable sleeve 122 were allowed to immediately rotate back to the first position.

Moreover, because the width power cable guard 120 does not immediately decrease to its minimum width, the cable sleeve 122 is held between the first position and the second position. As can be seen specifically in FIG. 6B, the cable sleeve 122 is positioned partially within the sled channel 106 and partially within the cable channel 108. As shown in the illustrated implementation, the cable sleeve 122 rotates clockwise back toward the first position. However, in implementations where the cable sleeve 122 and the obstruction are located adjacent to the second sidewall 105B of the housing 101, the cable sleeve 122 rotates counter-clockwise back toward the first position.

Figure 7B:
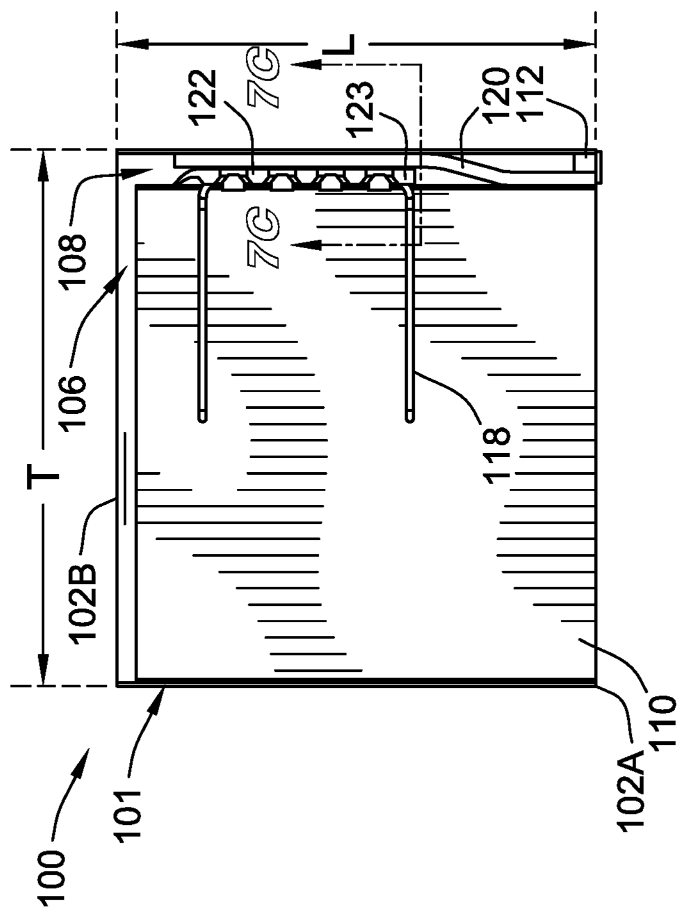
FIG. 7B is a top view of the server of FIG. 2 in the position illustrated in FIG. 7A.
Figure 7A:
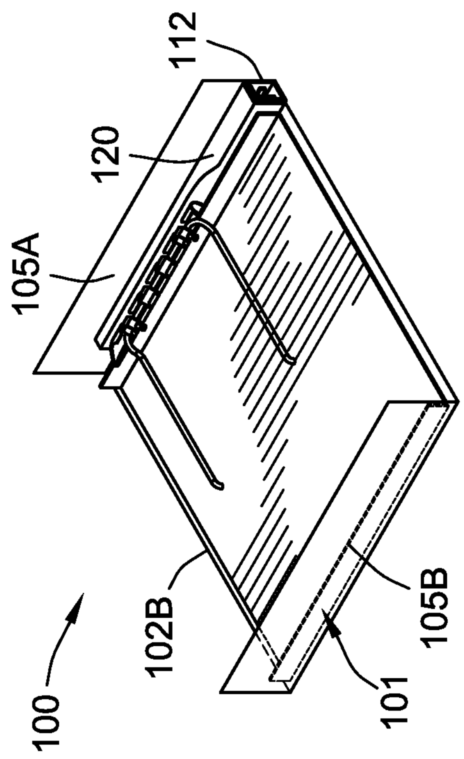
FIG. 7A is a perspective view of the server of FIG. 2 when the sled is fully inserted into the server, such that the cable sleeve is in the first position and within the cable channel.
Figure 7C:
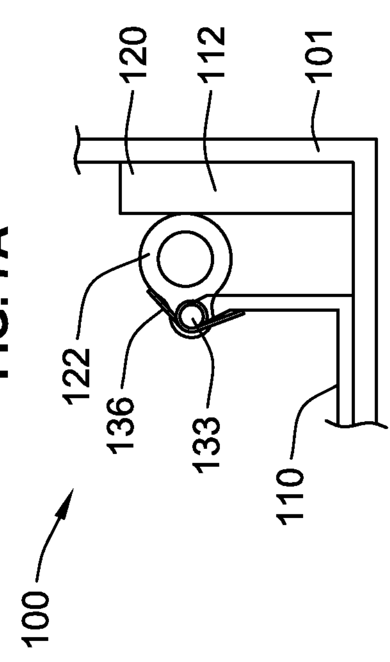
FIG. 7C is a rear view of the cable sleeve of FIG. 3A in the position illustrated in FIG. 7A.

FIGS. 7A-7C show the server 100 once the sled 110 has been fully inserted into the housing 101. As shown, the cable sleeve 122 has fully moved back to the first position due to the bias applied by the torsion spring 136. In this position, the cable sleeve 122 is again aligned with the power socket 112, the power cable guard 120, and the cable channel 108. However, because the cable sleeve 122 moved past the power socket 112 and the power cable guard 120 when in the second position, the cable sleeve 122 is now positioned substantially within the cable channel 108, and generally does not have any portion positioned in the sled channel 106.

While the present disclosure generally refers to the obstruction as being formed by the power socket 112 and the power cable guard 120, generally any combination of components can form the obstruction. In some implementations, the server 100 may just include a power socket 112. In other implementations, the server 100 may include a power socket 112 that is not aligned with the cable channel 108, and thus the obstruction is formed entirely from the power cable guard 120. In still other implementations, the server 100 contains other components that form the obstruction.

Other implementations of the server 100 are also contemplated. For example, in some implementations, contact between the cable sleeve 122 and the obstruction does not cause the cable sleeve 122 to move to the second position.

Rather, the cable sleeve 122 can be caused to move to the second position using other some mechanism or method. For example, the server 100 may be configured to sense when the cable sleeve 122 reaches the obstruction, and subsequently automatically move the cable sleeve 122 to the second position. The server 100 can also be configured to sense when the cable sleeve 122 has traveled past the point 121 where the obstruction has its maximum width. Responsive to sensing this, the server 100 can cause the cable sleeve 122 to move back to the first position. In other implementations, the server 100 may include a manually operated mechanism to allow a user to move the cable sleeve 122 between the first position and the second position, and/or between the second position and the first position.

In some implementations, the cable sleeve 122 is not rotationally mounted to the sled 110 of the server 100, but is instead translationally mounted to the sled 110. In these implementations, the cable sleeve 122 can be moved in one or more linear directions between the first and second positions. Other types of movement are also contemplated.

The server 100 can generally have any type of configuration. For example, the server 100 can include one, two, or any number of sleds 110. The sleds 110 can be arranged vertically, horizontally, or a combination of vertically and horizontally. The obstruction of the server 100 can generally have any shape or be formed from any number of different components, so long as the obstruction is aligned with the cable channel 108 and thus blocks the cable sleeve 122 from directly entering the cable channel 108. Moreover, the server 100 can also have multiple cable channels 108 with signal cables 118 that can be configured to move between positions to avoid obstructions within the housing 101. For example, in some implementations, both a first (bottom) sled 110 and a second (top) sled 110 have a cable sleeve 122 and a signal cable 118. The signal cable 118 and the cable sleeve 122 of both the first sled 110 and the second sled 110 can be moved between a first position and a second position to avoid the obstruction.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A server, comprising:

a housing that at least partially defines a sled channel and a cable channel;

a sled configured to be inserted into the sled channel of the housing at a first end of the housing and travel along a longitudinal axis of the housing;

a cable positioned within a cable sleeve, the cable sleeve being mounted to the sled;

an obstruction positioned at a first end of the housing and aligned with the cable channel and the cable sleeve along the longitudinal axis of the housing, wherein the cable sleeve has a chamfered end piece, and wherein during insertion of the sled into the housing, the chamfered end piece of the cable sleeve is configured to contact the obstruction responsive to the sled being inserted into the housing to cause the cable sleeve to rotate away from the sled and the obstruction from a first position relative to the sled to a second position relative to the sled, the cable sleeve in the second position being positioned at least partially within the sled channel.

2. The server of claim 1, wherein when the cable sleeve is in the first position relative to the sled, (i) the cable sleeve is positioned in alignment with the obstruction and the cable channel along the longitudinal axis, and (ii) the obstruction is positioned between the cable sleeve and the cable channel.

3. The server of claim 2, wherein when the cable sleeve is in the second position relative to the sled, the cable sleeve is not positioned in alignment with the obstruction and the cable channel along the longitudinal axis.

4. The server of claim 1, wherein contact between the cable sleeve and the obstruction causes the cable sleeve to move from the first position to the second position.

5. The server of claim 1, wherein the cable sleeve is rotationally mounted to the sled, and the contact between the cable sleeve and the obstruction causes the cable sleeve to rotate from the first position to the second position.

6. The server of claim 5, wherein an axis of rotation of the cable sleeve is parallel to the longitudinal axis of the housing.

7. The server of claim 4, wherein the cable sleeve is biased towards the first position.

8. The server of claim 7, wherein the cable sleeve includes one or more torsion springs configured to twist responsive to the cable sleeve moving from the first position to the second position, thereby imparting a torque on the cable sleeve to aid in biasing the cable sleeve toward the first position.

9. The server of claim 7, wherein the contact between the obstruction and the cable sleeve maintains the cable sleeve in the second position.

10. The server of claim 9, wherein as the sled continues to be inserted into the housing, the cable sleeve travels past the obstruction along the longitudinal axis of the housing such that the bias of the cable sleeve causes the cable sleeve to move back to the first position.

11. The server of claim 1, wherein the obstruction includes a power socket.

12. The server of claim 1, wherein the server further comprises:

an internal power cable disposed within the housing and electrically connected to the power socket; and a power cable cover at least partially surrounding the internal power cable, wherein at least a portion of the power cable cover is positioned in alignment with the cable channel and the power socket.

13. The server of claim 1, wherein the obstruction has a length that extends within the housing along the longitudinal axis and a width that extends within the housing along the transverse axis.

14. The server of claim 13, wherein a first end of the obstruction is positioned at the first end of the housing, and a second end of the obstruction is positioned at a second end of the housing away from the first end of the housing along the longitudinal axis.

15. The server of claim 14, wherein the width of the obstruction transitions from a first width at the first end of the obstruction to a second width at the second end of the obstruction, the second width being smaller than the first width.

16. The server of claim 15, wherein the width of the obstruction (i) gradually transitions between the first width and the second width along the length of at least a portion of the obstruction between the first end of the obstruction and the second end of the obstruction, or (ii) abruptly transitions between the first width and the second width at a point along the length of the obstruction between the first end of the obstruction and the second end of the obstruction.

17. The server of claim 1, wherein the obstruction and the cable channel occupy the same position along a transverse axis.

18. The server of claim 1, wherein the end piece is chamfered along a width of the cable sleeve and along a height of the cable sleeve such that the end piece tapers to a point configured to contact the obstruction responsive to the sled being inserted into the housing.

* * * * *